United States Patent
Nguyen et al.

(10) Patent No.: US 10,720,350 B2
(45) Date of Patent: Jul. 21, 2020

(54) ETCH-RESISTANT COATING ON SENSOR WAFERS FOR IN-SITU MEASUREMENT

(75) Inventors: Andrew Nguyen, San Jose, CA (US); Farhat Quli, Hayward, CA (US); Mei Sun, Los Altos, CA (US); Vasudev Venkatesan, San Jose, CA (US)

(73) Assignee: KLA-TENCORE CORPORATION, Milpitas, CA (US)

(*) Notice: Subject to any disclaimer, the term of this patent is extended or adjusted under 35 U.S.C. 154(b) by 326 days.

(21) Appl. No.: 12/892,841

(22) Filed: Sep. 28, 2010

(65) Prior Publication Data
US 2012/0074514 A1    Mar. 29, 2012

(51) Int. Cl.
| | |
|---|---|
| *H01L 23/28* | (2006.01) |
| *H01L 21/67* | (2006.01) |
| *H01J 37/32* | (2006.01) |
| *G01J 5/04* | (2006.01) |

(52) U.S. Cl.
CPC .. *H01L 21/67253* (2013.01); *H01J 37/32935* (2013.01); *G01J 5/045* (2013.01); *H01L 23/28* (2013.01)

(58) Field of Classification Search
CPC ..... H01L 21/0276; H01L 23/29; H01L 21/56; H01L 23/3171; H01L 41/23; H01L 41/0533; H01L 41/05; H01L 21/67; H01L 21/67253; H01L 21/672; H01L 21/6725; H01L 23/28; G01J 5/045; B81B 7/0032; B81B 7/0035; B81B 7/0038; B81B 7/0041; B81B 7/0058
See application file for complete search history.

(56) References Cited

U.S. PATENT DOCUMENTS

| | | | |
|---|---|---|---|
| 6,291,315 B1 | 9/2001 | Nakayama et al. | |
| 6,359,333 B1 * | 3/2002 | Wood et al. | 257/704 |
| 6,776,873 B1 | 8/2004 | Sun et al. | |
| 7,135,852 B2 | 11/2006 | Renken et al. | |
| 7,972,884 B2 | 7/2011 | Obata et al. | |
| 2002/0117623 A1 * | 8/2002 | Cole | 250/338.1 |

(Continued)

FOREIGN PATENT DOCUMENTS

| | | |
|---|---|---|
| CN | 1493089 A | 4/2004 |
| CN | 101218375 A | 7/2008 |

(Continued)

OTHER PUBLICATIONS

PCT International Search Report mailed date Apr. 12, 2012 for PCT International Application No. PCT/US2011/050272.

(Continued)

*Primary Examiner* — Fazli Erdem
(74) *Attorney, Agent, or Firm* — JDI Patent; Joshua D. Isenberg; Robert A. Pullman

(57) ABSTRACT

A sensor wafer may be configured for in-situ measurements of parameters during an etch process. The sensor wafer may include a substrate, a cover, and one or more components positioned between the substrate and the cover. An etch-resistant coating is formed on one or more surfaces of the cover and/or substrate. The coating is configured to resist etch processes that etch the cover and/or substrate for a longer period than standard thin film materials of the same or greater thickness than the protective coating.

16 Claims, 4 Drawing Sheets

(56) References Cited

U.S. PATENT DOCUMENTS

| | | | |
|---|---|---|---|
| 2003/0164529 A1* | 9/2003 | Inoue | H03H 9/02929 257/414 |
| 2004/0072384 A1* | 4/2004 | Cole | 438/64 |
| 2004/0173886 A1* | 9/2004 | Carley | B81C 1/00333 257/678 |
| 2004/0225462 A1* | 11/2004 | Renken | H01L 21/67253 702/94 |
| 2005/0213079 A1* | 9/2005 | Fink | 356/72 |
| 2006/0008951 A1 | 1/2006 | Yuasa | |
| 2006/0046450 A1* | 3/2006 | Narendar | C04B 35/16 438/585 |
| 2006/0174720 A1 | 8/2006 | Renken et al. | |
| 2007/0004080 A1* | 1/2007 | Ouyang | 438/106 |
| 2007/0046284 A1 | 3/2007 | Renken et al. | |
| 2007/0069174 A1* | 3/2007 | Natsuhara | B22F 7/02 252/62.55 |
| 2007/0138601 A1* | 6/2007 | Fan | H01L 21/67011 257/632 |
| 2007/0251339 A1* | 11/2007 | Wiese et al. | 73/866.1 |
| 2008/0106842 A1* | 5/2008 | Ito | H01L 21/67028 361/234 |
| 2008/0207432 A1* | 8/2008 | Hamada | 501/152 |
| 2009/0056441 A1 | 3/2009 | Sun et al. | |
| 2009/0133713 A1 | 5/2009 | Ohmi et al. | |
| 2009/0223450 A1 | 9/2009 | Moriya et al. | |
| 2009/0294880 A1 | 12/2009 | Feyh | |
| 2012/0112347 A1* | 5/2012 | Eckhardt | H01L 21/6835 257/751 |

FOREIGN PATENT DOCUMENTS

| | | |
|---|---|---|
| JP | H08306665 A | 11/1996 |
| JP | H1083986 A | 3/1998 |
| JP | 2007536726 | 11/2003 |
| JP | 2004153119 A | 5/2004 |
| JP | 2005156314 A | 6/2005 |
| JP | 2006049461 A | 2/2006 |
| JP | 2007243020 A | 9/2007 |
| JP | 2007294889 A | 11/2007 |
| JP | 2008306665 A | 12/2008 |
| JP | 2009212293 A | 9/2009 |
| KR | 20060135926 A | 12/2006 |
| KR | 20080034119 A | 4/2008 |
| TW | I465155 B | 11/2012 |
| WO | 2007007782 A1 | 1/2007 |

OTHER PUBLICATIONS

Chinese Office Action for CN Application No. 201180046126.7, dated Mar. 2, 2015.
Non-Final Office Action for U.S. Appl. No. 13/787,178, dated Apr. 20, 2015.
Japanese Office Action for JP Application No. 2013-531606, dated Apr. 14, 2015.
Notice of Allowance for U.S. Appl. No. 13/787,178, dated Sep. 2, 2015.
Taiwan Office Action for TW Application No. 103140537, dated Dec. 2, 2015.
Chinese Office Action for CN Application No. 201180046126.7, dated May 3, 2016.
Japanese Office Action for JP Application No. 2016-110390, dated Feb. 22, 2017.
Chinese Office Action for CN Application No. 201180046126.7, dated Mar. 31, 2017.
Korean Office Action for KR Application No. 10-2013-701941, dated Sep. 19, 2017.
Office Action dated Feb. 2, 2016 for Japanese Patent Application No. 2013-531606.
Chinese Office Action for Chinese Application No. 201811226232.3, dated Mar. 30, 2020.

\* cited by examiner

US 10,720,350 B2

ETCH-RESISTANT COATING ON SENSOR WAFERS FOR IN-SITU MEASUREMENT

FIELD OF THE INVENTION

Embodiments of this invention generally relate to semiconductor wafer processing and more particularly to a sensor wafer with a resistant coating used for an etch chamber.

BACKGROUND OF THE INVENTION

The fabrication of an integrated circuit, display or disc memory generally employs numerous processing steps. Each process step must be carefully monitored in order to provide an operational device. Throughout the imaging process, deposition and growth process, etching and masking process, etc., it is critical, for example, that temperature, gas flow, vacuum, pressure, chemical, gas or plasma composition and exposure distance be carefully controlled during each step. Careful attention to the various processing conditions involved in each step is a requirement of optimal semiconductor or thin film processes. Any deviation from optimal processing conditions may cause the ensuing integrated circuit or device to perform at a substandard level or, worse yet, fail completely.

Within a processing chamber, processing conditions vary. The variations in processing conditions such as temperature, gas flow rate and/or gas composition greatly affect the formation and, thus, the performance of the integrated circuit. Using a sensor having a substrate that is of the same or similar material as the integrated circuit or other device to measure the processing conditions provides the most accurate measure of the conditions because the material properties of the substrate are the same as those of the actual circuits that will be processed. Gradients and variations exist throughout the chamber for virtually all process conditions. These gradients, therefore, also exist across the surface of a substrate, as well as below and above it. In order to precisely control processing conditions at the wafer, it is critical that measurements be taken upon the wafer and are available in real time to an automated control system or operator to readily optimize the chamber processing conditions. Processing conditions include any parameter used to control semiconductor or other device fabrication or any condition a manufacturer would desire to monitor.

One technique for monitoring process conditions in-situ makes use of a measuring device having sensors incorporated onto a substrate similar to the wafers that are processed in the chamber. US publication No. 20060174720 discloses an example of a measuring device incorporating a substrate with sensors that measure the processing conditions that a wafer may undergo during manufacturing. The substrate can be inserted into a processing chamber by a robot and the measuring device can transmit the conditions in real time or store the conditions for subsequent analysis. Sensitive electronic components of the device can be distanced or isolated from the most deleterious processing conditions in order to increase the accuracy, operating range, and reliability of the device.

Monitoring etch conditions, e.g., the temperature, in-situ during an etch process (e.g., a plasma etch) using a sensor wafer is particularly problematic since the sensor wafer is subject to etching during monitoring of the process conditions in the chamber. An unprotected sensor wafer is therefore subject to attack, e.g., by silicon etch chemistry or plasma bombardment in an etch environment. Current sensor wafers use a silicon cover to protect the sensors and best simulate the workpieces being etched. However, when the silicon cover is subjected to the etch process black or white silicon is produced. The black or white silicon contamination can lead to particle generation, which is undesirable in the process chamber.

Some prior art sensor wafers based on silicon wafer substrates have used standard thin film materials such as polyimide or silicon oxide coatings to protect the sensor wafer from etching during measurement in plasma etch conditions. However, the polyimide and silicon oxide coatings have limited resistance to etch under poly and through-silicon via (TSV) etch conditions. For a sensor wafer used in a plasma etch chamber it would be desirable for the protective coating to last at least 10 hours. Experience with such coated wafers has shown that $SiO_2$ and polyimide coatings cannot last this long unless they are extremely thick, e.g., approximately 10 μm thick for $SiO_2$ and at least 100 μm thick for polyimide. Unfortunately, a thicker coating can introduce artifacts in temperature measurement and may also warp the wafer. Thus, there is an unmet need for a sensor wafer that can survive for 10 hours of cumulative exposure to a plasma etch environment.

In addition to being etch resistant, it would be further desirable for the coating to be relatively thin, non-contaminating, and strongly adhering to the cover and substrate material.

It is within this context that embodiments of the present invention arise.

BRIEF DESCRIPTION OF THE DRAWINGS

The teachings of the present invention can be readily understood by considering the following detailed description in conjunction with the accompanying drawings, in which.

DESCRIPTION OF THE SPECIFIC EMBODIMENTS

Figure 1A:
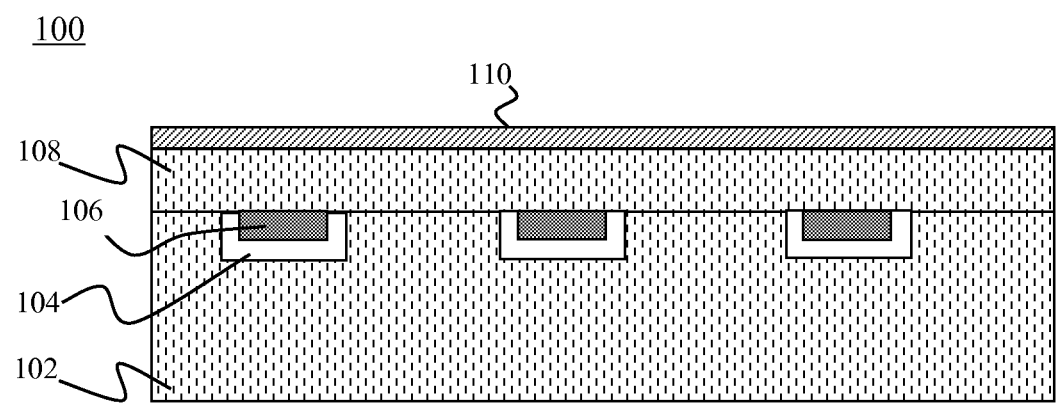
FIG. 1A is a cross-sectional view of a sensor wafer having an etch-resistant coating according to an embodiment of the present invention.

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Introduction

A number of different materials have been considered for use as protective coatings for sensor wafers. The inventors have determined that rare earth oxides represent one possible class of materials from which such a suitable coating might be fabricated. Rare earth oxides have been used to coat parts of a plasma etch chamber to make them etch resistant. Typically Al, $Al_2O_3$ or stainless are coated with such rare earth oxides. U.S. Pat. No. 6,776,873 discloses a high purity coating of yttrium oxide ($Y_2O_3$ also known as yttria) provided on anodized aluminum alloy parts or a high purity aluminum substrate to enhance the chamber material performance of anodized aluminum alloy materials against fluorine and oxygen plasma attack for semiconductor integrated circuit (IC) processing vacuum chambers.

Yttria coatings are typically applied by a plasma spray process. In plasma spraying process, the material to be deposited (feedstock) is introduced into a plasma jet, emanating from a plasma torch. The feedstock is typically a powder, and sometimes a liquid, suspension, or wire. In the plasma jet, where the temperature is on the order of 10,000 K, the feedstock material melts and is propelled towards a substrate. There, molten droplets of the material flatten, rapidly solidify, and form a deposit. Commonly, the deposits remain adherent to the substrate as coatings. A large number of technological parameters influence the interaction of the particles with the plasma jet and the substrate and therefore the deposit properties. These parameters include feedstock type, plasma gas composition and flow rate, energy input, torch offset distance, substrate cooling, etc.

Unfortunately, the coatings produced by plasma spraying are too thick and prone to particle generation to be useful as a wafer coating. Furthermore, there is no contamination data on yttria coated silicon wafers. Also, yttria-coated parts are not normally subjected to deliberate plasma bombardment in an etch chamber. Usually, the plasma in an etch chamber is confined in such a way that, during a normal etch process, only the wafer is subject to ion bombardment and chemical attack from the plasma. The coating is used to protect the chamber from attack during a chamber cleaning process. However, chamber cleaning does not involve energetic ion bombardment of the chamber parts and instead relies on reactive chemistry that is enhanced by the plasma.

To overcome the disadvantages of the prior art, embodiments of the present invention include a sensor wafer having a substrate and a cover with an etch-resistant rare earth oxide protective coating on its upper surface. The coating is configured to resist etching by etch processes that etch the cover and/or substrate for a longer period than standard thin film materials of the same or greater thickness than the protective coating. The coating may be formed by evaporative deposition, which is commonly used for making optical coatings on $SiO_2$. Alternatively, the etch-resistant coating may be formed with other methods such as physical vapor deposition (PVD), organometallic chemical vapor deposition (CVD), plasma processes, laser ablation, or other standard IC fabrication film deposition processes.

Examples of standard thin film materials include silicon oxide, polyimide, spin-on polyimide, silicon nitride, spin-on glass, photoresist, aluminum nitride, titanium nitride, and the like.

Embodiments

FIG. 1A is a cross section of a sensor wafer 100 according to an embodiment of the present invention. A sensor wafer 100 is sometimes also referred to as a process condition measuring device (PCMD). An example of such a sensor wafer, a method for its manufacture and a handling system for use with the PCMD are described in detail in U.S. Pat. No. 7,135,852 to Wayne Glenn Renken et al., the disclosures of which are incorporated herein by reference.

In this illustrative example, the sensor wafer 100 includes a substrate 102, e.g., a silicon wafer with various layers formed upon the wafer. Cavities 104 are formed on a top portion of the substrate 102. Components 106 can be embedded into the cavities 104 as shown in FIG. 1A. The components may include sensors or electronic components, such as processors, transceivers, memory, batteries, and the like. A cover 108 is then attached to the top of the substrate 102 and covers the components 106. The cover 108 is preferably made of a semiconductor material that is the same material as standard production wafers that are subject to an etch process in an etch chamber. By way of example, and not by way of limitation, the substrate 102, or the cover 108, or both may be made of silicon. An etch-resistant coating 110 is formed on the top of the cover 108 to prevent the wafer from etching in an etch environment during measurement of that environment with the sensor wafer 100. The etch-resistant coating 110 preferably includes a film of a rare earth oxide such as yttria ($Y_2O_3$) approximately 2 microns thick or less. Alternatively oxides of other rare earth elements, e.g., hafnium, may be used to form the etch-resistant coating 110. Other possible candidates for the silicon etch chemistry resistant film 110 include silicon oxide and alumina.

Figure 1B:
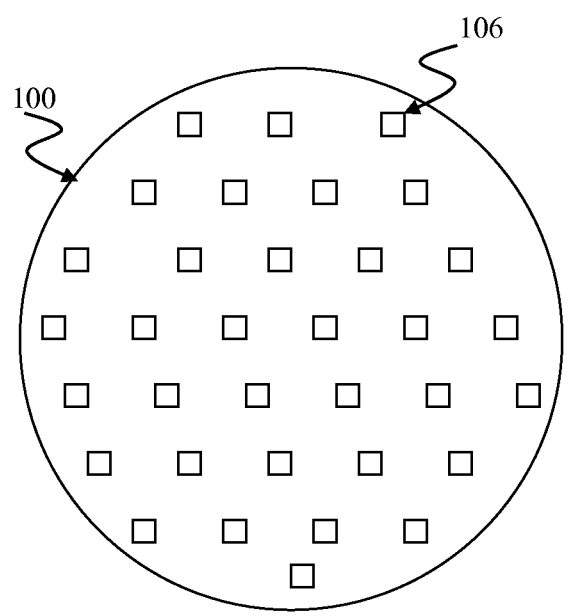
FIG. 1B is a top view of the sensor wafer of FIG. 1A.

FIG. 1B illustrates the preferred layout of components 106 embedded in/on substrate 102. By way of example, the components may include one or more sensors 106 that are arranged in different areas on the surface or within substrate 102 in order to measure the processing conditions across the substrate. As defined herein, "processing conditions" refer to various processing parameters used in manufacturing an integrated circuit. Processing conditions include any parameter used to control semiconductor manufacture or any condition a manufacturer would desire to monitor such as, but not limited to, temperature, etch rate, thickness of a layer on a substrate, processing chamber pressure, gas flow rate within the chamber, gaseous chemical composition within the chamber, position within a chamber, electrical plasma properties, light energy density, and vibration and acceleration of a wafer or other substrate within a chamber or during movement to or from a chamber. Different processes will inevitably be developed over the years, and the processing conditions will, therefore, vary over time. Therefore, whatever the conditions may be, it is foreseen that the embodiments described can measure such conditions. In addition to measuring these conditions during the processing of semiconductor wafers, the systems and techniques described herein may also be applied to monitoring similar conditions during processing of other types of substrates, such as wafer masks.

By measuring in different areas of the substrate, the gradient across the substrate can be calculated, and additionally, the condition at a particular location on the substrate can be determined The number of sensors in or on the substrate 102 may vary depending upon the processing condition being measured and the size of the substrate 102. By way of example, and not by way of limitation, a 200 mm diameter substrate may have 55 sensors for measuring temperature, whereas a 300 mm diameter substrate may have 65 sensors. The sensors can be configured to detect various processing conditions and may be mounted on or fabricated in substrate 102 according to well known semiconductor transducer designs. In embodiments of the present invention, the sensors may be configured for use in detecting etching parameters of an etch plasma during a plasma etch process.

For measuring temperature, a popular transducer is an RTD or thermistor, which includes a thin-film resistor material having a known temperature coefficient of resistance. A magneto-resistive material may also be used to measure the temperature through the amount of magnetic flux exerted upon substrate 102. A resistance-to-voltage converter can be formed within the substrate 102 between distal ends of the resistive-sensitive material (either thermistor or magneto-resistive material) so that the voltage may easily be correlated with a temperature scale. Another possible temperature sensor includes a thermocouple made of two dissimilar conductors lithographically formed in the layers of the substrate 102. When a junction between the conductors is heated, a small thermoelectric voltage is produced which increases in some known way (e.g., approximately linearly) with junction temperature. Another example of a temperature sensor includes a diode that produces a voltage drop that increases with temperature. By connecting the diode between a positive supply and a load resistor, current-to-voltage conversion can be obtained from the load resistor.

Another possible type of sensor is a piezoelectric device such as a quartz tuning fork fabricated from a quartz crystal cut on a crystal orientation that exhibits a temperature dependent frequency of oscillation. The sensor's oscillating frequency can be referenced against a master oscillator formed by a piezoelectric device such as a quartz tuning fork, which is fabricated from a crystal oriented to minimize frequency change with temperature. The frequency difference between the sensor and master oscillator would provide a direct temperature dependent signal. Piezoelectric sensors may also be used to sense mass change to measure deposition mass and rates or other process conditions.

The sensors may also be used to measure pressure, force or strain at select regions across the substrate 102, either as a discrete sensor or a sensor integrally formed in the layers of the substrate 102. There are many types of pressure transducers capable of measuring the atmospheric pressure exerted upon the wafer. A suitable pressure transducer includes a diaphragm-type transducer in which a diaphragm or elastic element senses pressure and produces a corresponding strain or deflection that can then be read by a bridge circuit connected to the diaphragm or a cavity behind the diaphragm. Another suitable pressure transducer may include a piezoresistive material placed within the substrate 102. The piezoresistive material can be formed by diffusing doping compounds into selected portions of the substrate 102. The resulting piezoresistive material produces output current proportional to the amount of pressure or strain exerted thereupon.

The sensors may also be used to measure flow rate across substrate 102. In addition, humidity and moisture sensors can also be formed upon substrate 102. A well-known method for measuring flow rate, a hot-wire anemometer, may be incorporated into the substrate 102. Fluid velocity is based upon the frequency of vortex production as a streamlined fluidic flow strikes a non-streamlined obstacle positioned on or in the substrate 102. Measurement of fluid flow generally involves the formation of special vortices on either side of the obstacle. Thus, an alternating pressure difference occurs between the two sides. Above a threshold (below which no vortex production occurs), the frequency of alternation of the pressure difference is proportional to fluid velocity. Of many methods of detecting the alternating pressure difference, a hot thermistor can be placed in a small channel between the two sides of the obstacle. The alternating directions of flow through the capitalized channel periodically cool the self-heated thermistor thereby producing an AC signal and corresponding electric pulses at twice the vortex frequency. Therefore, an obstacle protruding from the substrate 102 in front of a thermistor can provide solid-state flow rate measurement. Heat can be transferred between self-heated thermistors placed in close proximity to each other. Fluid flow transfers thermal energy between the adjacent thermistors causing a thermal imbalance proportional to mass flow. Two or more adjacent sensors can be arrayed to measure flow along a vector, or multiple flow vectors may also be sensed. The thermal imbalance can be detected to produce a DC signal related to mass flow. Flows in multiple directions can be compared to detect flow vectors.

The sensors can also be used to measure the gaseous chemical concentration placed upon the substrate 102. Chemical composition sensors utilize a membrane which is permeable to specific ions to be measured. Ideally, the membrane should be completely impermeable to all other ions. The conductivity of the membrane is directly proportional to the transport of select ions which have permeated the membrane. Given the variability of membrane conductivity, measurements can be taken which directly correlate to the amount of chemical ions present within the ambient surrounding the substrate 102.

The sensors may also be used to measure ion current density and ion current energy with a parallel plate structure, an array of collecting plates, and collecting plates with control grids supported above the collecting plates. The current flowing between parallel plates, or to the array of collecting plates, will increase with ion current density. Ion current energy can be detected by applying a constant or varying DC potential on the grids above the plates, allowing the energy distribution to be characterized. This is useful in monitoring and regulating a deposition or etching process.

A piezoelectric transducer/sensor may also be integrated into the substrate 102 to measure the resonant frequency of a layer and thus determine the mass or thickness of the layer.

Additionally, the sensors can also be used to detect a change in position or displacement of an object spaced from the substrate 102. Exemplary displacement transducers include electro-optical devices which can measure photon energy (or intensity) and convert photon energy to an electric field or voltage. Relatively well known electro-optical devices include light-emitting diodes, photodiodes, phototransistors, etc., which can be formed upon a semiconductor substrate or embedded within the substrate or placed on the surface. Displacement sensors are used to provide accurate information about electrode spacing within an etch chamber or deposition chamber, and can also provide spacing information between a wafer and corresponding masks and/or radiation source.

The sensor wafer 100 can be configured for silicon etch applications in IC manufacturing. Examples of these silicon etch applications include Poly Etch, STI Etch, TSV Etch. The purpose of the sensor wafer is to measure temperature in-situ during plasma etch. Critical requirements of such a sensor wafer configuration are at least 10-hr lifetime in silicon etch environments, maintaining wafer flatness and temperature stability during the etch process and throughout the life of the film, and acceptable particles contamination levels as measured by OEM/fab transfer tests. In such a case, the cover 108 and substrate 102 may be made of silicon.

Figure 1C:
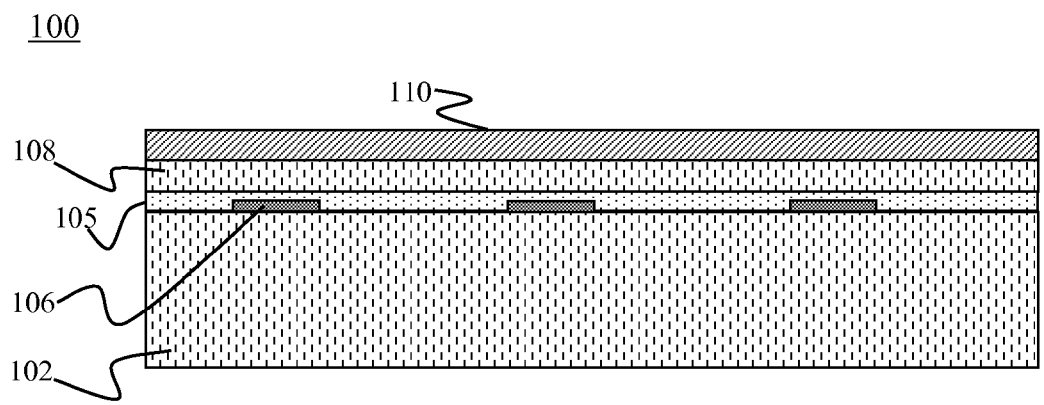
FIG. 1C is a schematic cross-sectional view of a sensor wafer having an etch-resistant coating according to an alternative embodiment of the present invention.
Figure 1D:
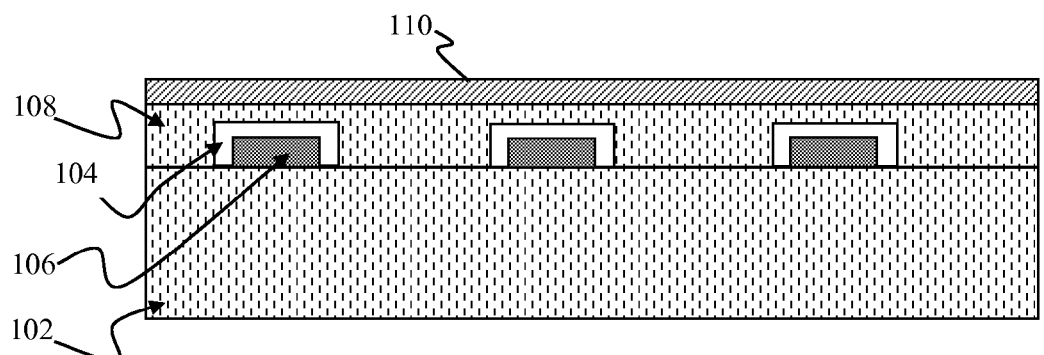
FIG. 1D is a schematic cross-sectional view of a sensor wafer having an etch-resistant coating according to another alternative embodiment of the present invention.
Figure 1E:
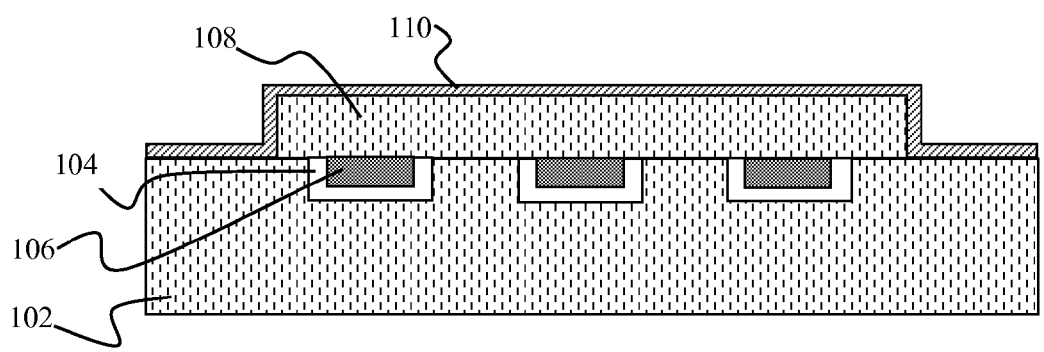
FIG. 1E is a schematic cross-sectional view of a sensor wafer having an etch-resistant coating according to another alternative embodiment of the present invention.

A number of variations on the embodiment depicted in FIG. 1A are possible. For example, as seen in the exploded view in FIG. 1C, some components 106 can be formed directly on the back side of the cover or the top surface of the substrate as part of a thin film 105, which may be attached to or formed between the substrate 102 and the cover 108. By way of example and not by way of limitation, the thin film 105 may include bonding agent or adhesive that bonds the cover 108 to the upper surface of the substrate 102. In some cases, the components 106 may be formed in cavities in the cover 108 as shown in FIG. 1D. In some embodiments the substrate 102 may be made of a semiconductor material such as silicon and the cover 108 does not completely cover a top surface of the substrate 102, e.g., as illustrated in FIG. 1E. In such a case, the etch-resistant coating 110 may cover portions of the top surface of the substrate 102 that are not covered by the cover 108. It is noted that although a single cover 110 is illustrated in FIG. 1E, there may be more than one cover with each cover covering a different portion of the top surface of the substrate 102.

It is desirable for the coating 110 to be non-contaminating. For example, certain films, such as aluminum oxide ($Al_2O_3$), aluminum nitride (AlN), and titanium nitride (TiN) would probably lead to contamination. It is preferably that the coating 110 does not contain contaminating metals. As used herein, the term contaminating metals includes metals that are unacceptable for semiconductor processing cleanliness reasons. Examples of contaminating metals include copper, aluminum, sodium, calcium, potassium, titanium, gold, copper, platinum, and transition metals.

According to an embodiment of the present invention, the protective coating 110 can be a rare earth oxide film, such as $Y_2O_3$ film deposited on top of the cover layer 108, which can be made of silicon. It is generally desirable that the protective coating 110 is sufficiently thin that it does not crack during handling and use. It is also generally desirable for the coating 110 to be non-thermally perturbing. As used herein, the expression "non-thermally perturbing" means that the temperature of the wafer does not deviate by a significant amount from what it would be if the coating were not present. This is largely a function of the thickness of the film 110. By way of example, the protective coating 110 may be approximately 2 microns or less, preferably 1.5 microns or less, still more preferably, 1.2 microns or less in thickness. The film may also cover the side edge of the sensor wafer 100 and a portion of the back surface, e.g., within a few millimeters of the edge. The film can be deposited by e-beam evaporation with the surface being coated at a temperature in a range from room temperature to 250° C.

Figure 2A:
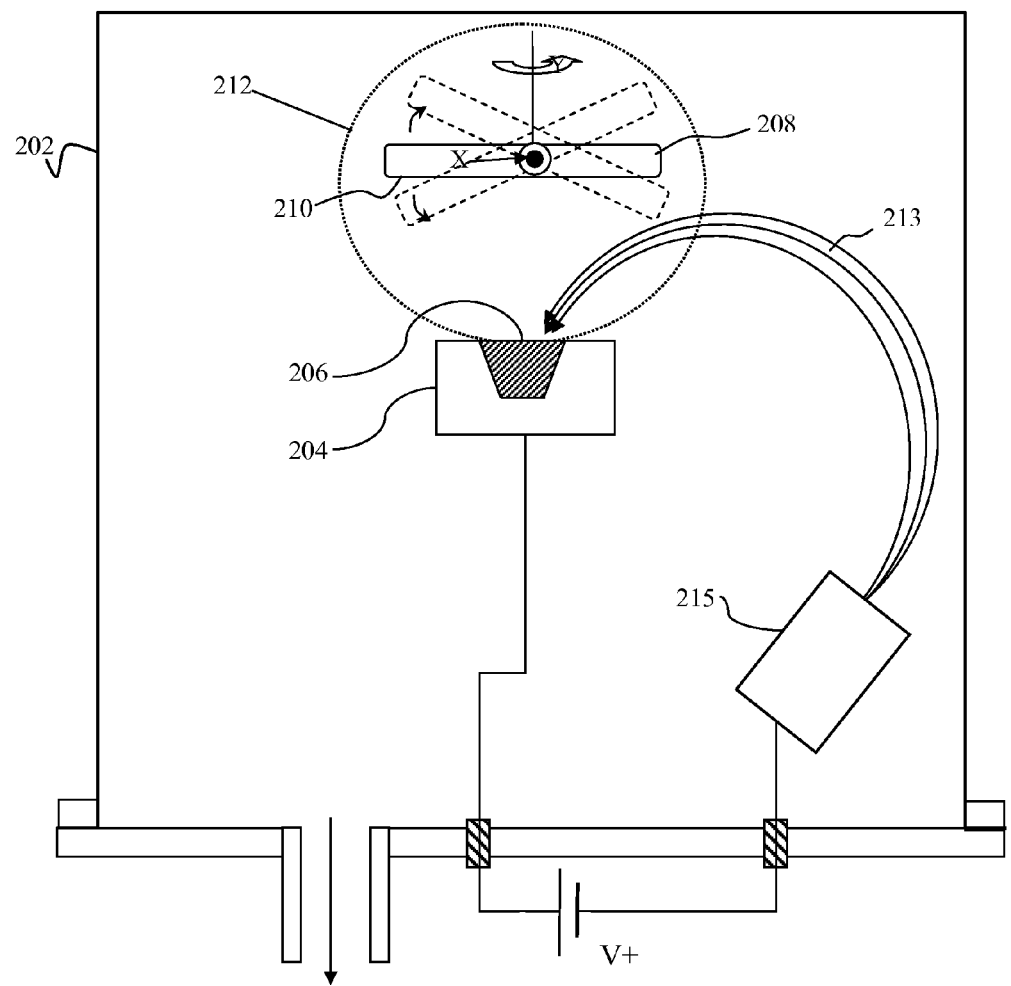
FIG. 2A is a schematic diagram showing an apparatus for making the sensor wafer having an etch-resistant coating according to another embodiment of the present invention.

FIG. 2A is a schematic diagram showing an apparatus for making the etch-resistant coating on top the cover layer of a sensor wafer. The process of making the etch-resistant coating can be performed in a vacuum chamber 202. The vacuum chamber may be evacuated through a suitable vacuum system (not shown).

As shown in FIG. 2A, a rare earth oxide material 206, such as $Y_2O_3$, is deposited in a crucible 204. The rare earth oxide material may be in the form of a powder. The crucible 204 is preferably made of a material having a higher melting point than the boiling point of the rare earth oxide material. A partially or fully fabricated sensor wafer 208 of the type depicted in FIG. 1A without the etch-resistant coating 110 is suspended over the crucible 204 with a front surface 210 facing the rare earth oxide material 206 in the crucible 204. An electron beam 213 bombards the rare earth oxide material 206 heating it to a sufficiently high temperature that the oxide material evaporates. The electron beam 213 may be generated by an electron gun 215. The electron gun may generate electrons with a cold cathode emitter or by heating a filament with an electric current. The electron beam is accelerated toward the rare earth oxide by applying a high voltage difference (e.g., a kilovolt or more) between the electron gun 215 and the crucible 204. The electrons can be deflected toward the rare earth oxide material 206, e.g., using a magnetic field. The focusing of the electron beam with the electron gun 215 and deflection of the beam by the magnetic field allows the beam to be highly focused onto the material 206 with a high power density. The high power density of the electron beam produces localized heating of the rare earth oxide material 206. If desired, the crucible 204 can be cooled, e.g., through cooling lines carrying water as the rare earth oxide is locally heated by the electron beam. The localized heating evaporates the rare earth oxide material 206 forming an evaporation plume 212 around the sensor wafer 208 and depositing a rare earth oxide coating on the front surface 210, the vertical sides, the top and bottom bevels and the edges of the back surface of the sensor wafer 208 to form the etch-resistant coating 214.

Figure 2B:
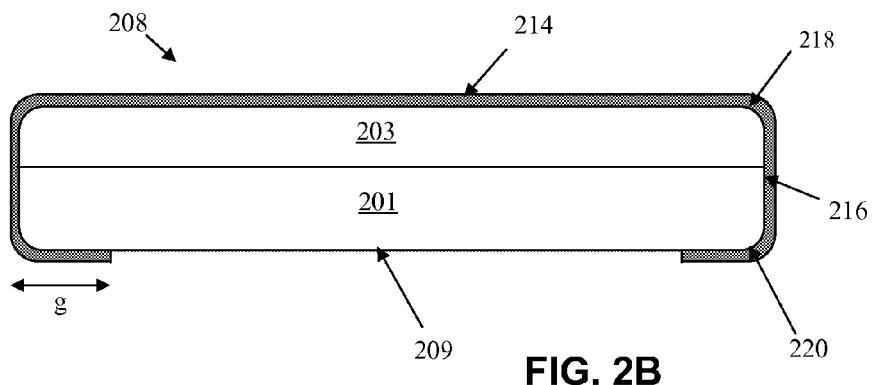
FIG. 2B is a side view of a sensor wafer of the type depicted in FIG. 1 illustrating the top and bottom bevels.

FIG. 2B is a side view of the sensor wafer 208, which includes substrate 201 and cover 203 with top and bottom bevels 218 and 220 respectively, a front surface 210, a back surface 209, and a vertical side 216. The coating 214 is formed on the front surface 210, the vertical side 216 and the top and bottom bevels 218 and 220 of the sensor wafer 208. The coating 214 can coat the edge of the top cover 203 and substrate 201 and wrap around the bottom surface of the substrate to a within distance g of approximately 3 mm to 5 mm from the edge by exposing the edge to the evaporation plume. The thickness of the coating 214 is preferably approximately 2 microns or less.

To form a uniform coating 214, the sensor wafer can be rotated about Y-axis. The sensor wafer 208 can also be tilted at a sufficient angle about an X-axis as it rotates to allow the coating 214 to form at the vertical side, top and bottom bevels and the edges of the back surface.

Protection of the side edge and backside of the sensor wafer are optional. In some cases, the backside of the sensor wafer near the edge may be subject to etching if the sensor wafer slightly overhangs an edge of a chuck that secures the wafer in the etch chamber. The protective coating on the backside within a few millimeters of the edge can be useful, e.g., if the etching of the backside would interfere with handling of the sensor wafer.

Experiments

Experiments have been done with sensor wafers having silicon covers. The covers were coated with different types of protective film. The films included a rare earth oxide ($Y_2O_3$) and some standard films, such as silicon oxide (e.g., $SiO_2$), Kapton, and spin-on polyimide. Kapton refers to a polymer having the chemical formula poly(4,4'-oxydiphenylene-pyromellitimide). Kapton is a Trademark of E. I. Du Pont De Nemours and Company of Wilmington, Del. The films were studied for etch rate, wafer warpage, film effect on wafer temperature range and accuracy and metallic contamination. The coatings had similar performance with respect to wafer warpage, film effect on wafer temperature range and accuracy and metallic contamination under the same etch conditions. However, there was a significant different in the etch rate. A lifetime for each film was estimated by dividing the measured etch rate by the measured film thickness. The only film with an estimated lifetime greater than 10 hours was the $Y_2O_3$ film, which, at 1.5 microns thick, was also the thinnest film tested. The etch rate for this film was undetectable, which would suggest a lifetime substantially greater than 10 hours and substantially greater than any of the other films. The next best film (2-micron thick $SiO_2$), was estimated to last less than 5 hours. The 50-micron thick Kapton film was estimated to last approximately 3 hours and the 2-micron thick spin-on polyimide was estimated to last less than 15 minutes.

A sensor wafer with a 1.5 micron thick $Y_2O_3$ coating film was used in a Prototype Test in a typical poly etch reactor with HBr Chemistry. The prototype test was performed in typical HBr poly etch recipe.

Test results showed that the chamber temperature variance between silicon sensor wafers with and without $Y_2O_3$ coating film was within measurement noise. Thus, the presence of the coating does not have a significant effect on the temperature measured by the sensors and the coating can be said to be non-thermally perturbing. The observed etch rate of $Y_2O_3$ coating film was minimal to none. There was no significant sensor-to-sensor temperature variation $\Delta T$ among sensor wafers with and without the $Y_2O_3$ coating film. Furthermore, the sensor to sensor wafer temperature was stable over the course of the test with the plasma on, and no sign of $Y_2O_3$ film degradation or erosion under different plasma etch processes has been detected. These test results were similar to a prototype test in a typical STI (shallow trench isolation) etch reactor using sulfur hexafluoride ($SF_6$) etch chemistry.

The performance of a $Y_2O_3$-coated sensor wafer exceeded expectations. There were no signs of erosion of the film. However, it has been observed that the sensor wafer is subject to erosion if there are pinholes in the protective coating. The presence of pinholes is believed to be due to lack of cleanliness of the wafer surface. Such defects are believed to include particles, scratches, and regions of contamination that would prevent nucleation of the film and lead to a non-uniform coating. It is believed that the size of the defects determines the size of the pinholes in the subsequent coating. Pinhole defects may be reduced or possibly eliminated by cleaning the wafer prior to coating and then inspecting the wafer to determine whether any defects are present on the surface of the wafer that are larger than some acceptable maximum size or present in some greater-than-acceptable concentration. For example, the wafer surface may be scanned for defects using a standard wafer inspection tool. The acceptable maximum size and concentration of the pinholes may vary depending on the etch process. By way of example, for $Y_2O_3$ film approximately 1.2 µm thick subjected to an aggressive etch with sulfur hexafluoride ($SF_6$) an acceptable maximum size for the pinholes may be 10 µm and the maximum acceptable concentration may be 45 pinholes per 25 mm×25 mm square (roughly 7 pinholes per square centimeter). An example of an aggressive etch with $SF_6$ would be a plasma etch at a power of approximately 600 W TCP with a 500 V bias, a pressure of 20 milliTorr and gas flow rates of 125 SCCM for Chlorine ($Cl_2$), 15 SCCM for Oxygen ($O_2$), 15 SCCM for $SF_6$ and 50 SCCM for Helium (He).

To reduce the size and concentration of pinholes (particularly near the edge), the sensor wafer cover can be specially cleaned and handled before forming the etch-resistant coating to remove particles and/or organic contaminants.

Figure 3:
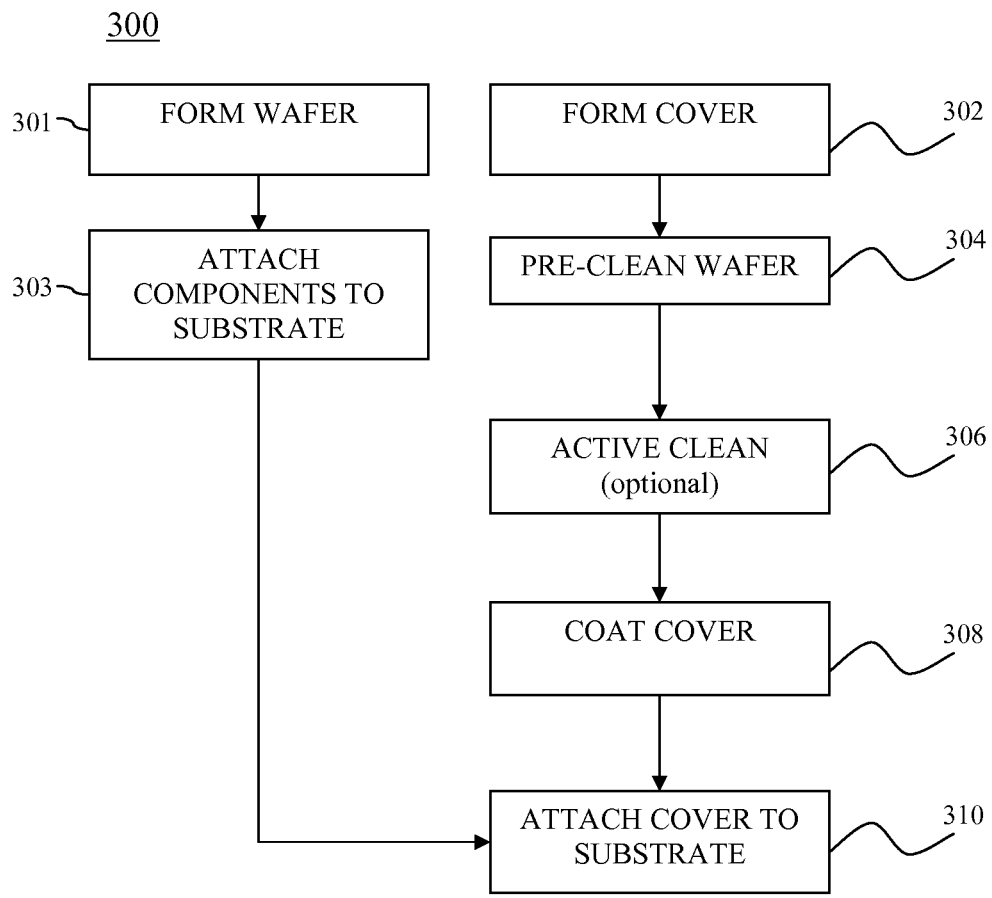
FIG. 3 is a flow diagram illustrating a method for making an etch-resistant coating on a wafer.

FIG. 3 is a flow diagram showing a method 300 for making a sensor wafer. A substrate is formed, as indicated at 301, and a cover is formed, as indicated at 302. Specifically, a standard silicon wafer may be ground down to a desired thickness to form the substrate. The cover may similarly be formed from a standard silicon wafer that is ground down to a desired thickness. Contacts may be ground into one side of the cover. The cover may be subjected to caustic wet cleaning, e.g., in potassium hydroxide (KOH), ground down to the desired thickness from both sides and polished. Sensors (and optionally other electronic components, such as processors, transceivers, memory, batteries, and the like) may be attached to the substrate as indicated at 303. For example, cavities may be formed in an upper surface of the wafer and the sensors and other components can be secured in place in the cavities. In some embodiments, the sensors and other components may be attached to a backside of the substrate cover at locations corresponding to locations of the cavities in the upper surface of the substrate. In other embodiments, cavities may be formed in the wafer cover and the sensors and other components may be attached directly to the upper surface of the sensor wafer at locations corresponding to the locations of the cavities.

The upper surface of the cover is pre-cleaned as indicated at 304 to reduce pinhole concentration and pinhole size. By way of example, the upper surface of the cover may be cleaned by any standard techniques used to remove organic contaminants and/or particles. After pre-cleaning, the upper surface of the cover may be actively cleaned, e.g., with a plasma or fast neutral beam, as indicated at 306. Once cleaned, the upper surface of the cover can be coated with a protective coating, as indicated at 308. Specifically, the upper surface may be coated with a rare earth oxide, such as $Y_2O_3$ by evaporation or physical vapor deposition. The coating may be approximately 1.15 µm thick, e.g., between 1.1 µm and 1.2 µm thick. Experiments have shown that such a coating thickness is sufficiently thin to avoid formation of cracks.

After the cover has been cleaned, the wafer cover can be attached to the upper surface of the substrate, as indicated at 310. Any suitable wafer bonding process may be used to secure the cover in place with the sensors between the upper surface of the substrate and the cover. The coated upper surface of the cover forms the upper surface of the resulting sensor wafer. To reduce pinhole formation during fabrication, the cover may be handled at the edge only during fabrication and contact with the surface of the cover may be avoided during attachment of the cover to the substrate and other processing.

The exact sequence of fabrication of the substrate and the cover is not particularly important so long as the sensors are in place by the time the cover is attached to the substrate. The thickness of the substrate and the cover may be selected so that the finished sensor wafer has roughly the same thickness as a standard production wafer that is processed in the etch chamber that the sensor wafer is to be used to monitor. In some embodiments, the cover can be coated after attachment to the wafer. This allows the side edges and backside edge exclusion zone to be coated along with the front surface of the wafer cover.

A sensor wafer fabricated as described above, may be used to characterize processes within a plasma etch chamber used for etching silicon. The sensor wafer described herein can alternatively be used in Poly Etch chamber process characterization or wet etch, e.g., KOH characterization.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature described herein, whether preferred or not, may be combined with any other feature described herein, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A sensor wafer, comprising:
   a substrate;
   a cover attached to the substrate;
   a plurality of components positioned between the cover and the substrate; and
   an etch-resistant coating formed on one or more surfaces of the cover and one or more surfaces of the substrate, wherein the cover is disposed between at least part of the coating and at least part of the substrate, wherein the coating is configured to resist etch processes that etch the cover and/or substrate for a longer period than a standard thin film material of silicon oxide, polyimide, spin-on polyimide, silicon nitride, spin-on glass, photoresist, aluminum nitride, or titanium nitride of the same or greater thickness than the coating, wherein the plurality of components includes one or more sensors and one or more electronic components in addition to the one or more sensors, and wherein the one or more electronic components include a processor, a transceiver, a memory, a battery, or a combination thereof.

2. The sensor wafer of claim 1, wherein the etch-resistant coating has a thickness of approximately 2 microns or less.

3. The sensor wafer of claim 1, wherein the etch-resistant coating comprises a layer of rare earth oxide.

4. The sensor wafer of claim 3, wherein the rare earth oxide includes yttrium oxide ($Y_2O_3$).

5. The sensor wafer of claim 1 wherein the etch-resistant coating contains no cracks.

6. The sensor wafer of claim 1, wherein a lifetime of the etch-resistant coating is at least 10 hours.

7. The sensor wafer of claim 1 wherein the etch-resistant coating coats an edge of the cover and an edge of the substrate.

8. The sensor wafer of claim 1 wherein the cover is made of a semiconductor material.

9. The sensor wafer of claim 8 wherein the cover is made of silicon.

10. The sensor wafer of claim 1 wherein the substrate is made of a semiconductor material.

11. The sensor wafer of claim 10 wherein the substrate is made of silicon.

12. The sensor wafer of claim 1 wherein the one or more sensors include a temperature sensor and wherein the etch-resistant coating is non-thermally perturbing during an etch process and throughout a lifetime of the etch-resistant coating.

13. The sensor wafer of claim 1, wherein the etch-resistant coating does not contain contaminating metals.

14. The sensor wafer of claim 1, wherein the one or more sensors include an RID, a thermistor, a thermocouple, a piezoelectric sensor, a pressure transducer, a flow rate sensor, a humidity sensor, a moisture sensor, a chemical composition sensor, an ion current density sensor, a displacement sensor, or a combination thereof.

15. The sensor wafer of claim 1, wherein the substrate is a whole undiced wafer substrate.

16. The sensor wafer of claim 1, wherein the etch-resistant coating coats an upper surface of the cover.

* * * * *